(12) United States Patent
Hagen et al.

(10) Patent No.: US 10,763,791 B2
(45) Date of Patent: Sep. 1, 2020

(54) SELECTIVE LINEARIZATION OF SCALABLE FAULT TOLERANT FREQUENCY AGILE TRANSMITTERS

(71) Applicant: MOTOROLA SOLUTIONS, INC., Chicago, IL (US)

(72) Inventors: Rodney W. Hagen, Lake In The Hills, IL (US); Mitchell R. Blozinski, Lake In The Hills, IL (US); Dennis M. Drees, Deer Park, IL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 16/231,353

(22) Filed: Dec. 21, 2018

(65) Prior Publication Data

US 2020/0204118 A1 Jun. 25, 2020

(51) Int. Cl.
| | |
|---|---|
| *H03F 1/14* | (2006.01) |
| *H03F 1/02* | (2006.01) |
| *H03F 1/32* | (2006.01) |
| *H04B 1/04* | (2006.01) |
| *H03F 3/24* | (2006.01) |

(52) U.S. Cl.
CPC ......... *H03F 1/0277* (2013.01); *H03F 1/3247* (2013.01); *H03F 3/24* (2013.01); *H04B 1/0475* (2013.01)

(58) Field of Classification Search
CPC ........ H03F 1/0277; H03F 3/24; H03F 1/3247; H03F 3/211; H03F 3/602; H03F 3/604; H03F 1/0288; H03F 3/72; H03F 3/607; H03F 3/60; H04B 1/0475; H04B 1/04; H04B 2001/0408; H03G 1/0088

USPC ............... 330/51, 124 R, 149, 295, 286
See application file for complete search history.

(56) References Cited

U.S. PATENT DOCUMENTS

| | | | |
|---|---|---|---|
| 5,949,283 A | 9/1999 | Proctor et al. | |
| 8,362,837 B2 * | 1/2013 | Koren | H03F 1/0277 330/124 R |
| 2002/0125944 A1 | 9/2002 | White et al. | |

(Continued)

OTHER PUBLICATIONS

International Search Report and Written Opinion dated Feb. 12, 2020 for related International Application No. PCT/US2019/064965 (14 pages).

*Primary Examiner* — Khanh V Nguyen

(74) *Attorney, Agent, or Firm* — Michael Best & Friedrich LLP

(57) ABSTRACT

Apparatus and method for selective linearization of scalable fault tolerant frequency agile transmitters. In one embodiment, the method includes receiving timestamped carrier configurations and segmenting the timestamped carrier configurations into time segments having a pre-determined time length. The method also includes determining composite carrier configuration in a present time segment for a predetermined number of future time segments and determining a correction solution of a plurality of correction solutions associated with the composite carrier configuration in a mapping of a plurality of carrier configurations and the plurality of correction solutions. The method includes providing the correction solution to a linearizer of at least one of a plurality of multi-carrier power amplifiers. The plurality of power amplifiers are provided in one or more banks of multi-carrier power amplifiers.

14 Claims, 6 Drawing Sheets

(56) References Cited

U.S. PATENT DOCUMENTS

2012/0281737 A1    11/2012   Hung et al.
2018/0159483 A1    6/2018   Masood et al.

\* cited by examiner

SELECTIVE LINEARIZATION OF SCALABLE FAULT TOLERANT FREQUENCY AGILE TRANSMITTERS

BACKGROUND OF THE INVENTION

Multi-carrier base stations and transmitters (referred to as radio frequency (RF) transmitters) are used in cellular technologies to transmit radio signals over multiple carriers (that is, channels). One or more carrier signals are encoded with information and transmitted to user devices. In cellular applications, the carrier attributes of the carrier signals are typically static. That is, the frequency, bandwidth, power, and the like of the carrier signal remain constant over time.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
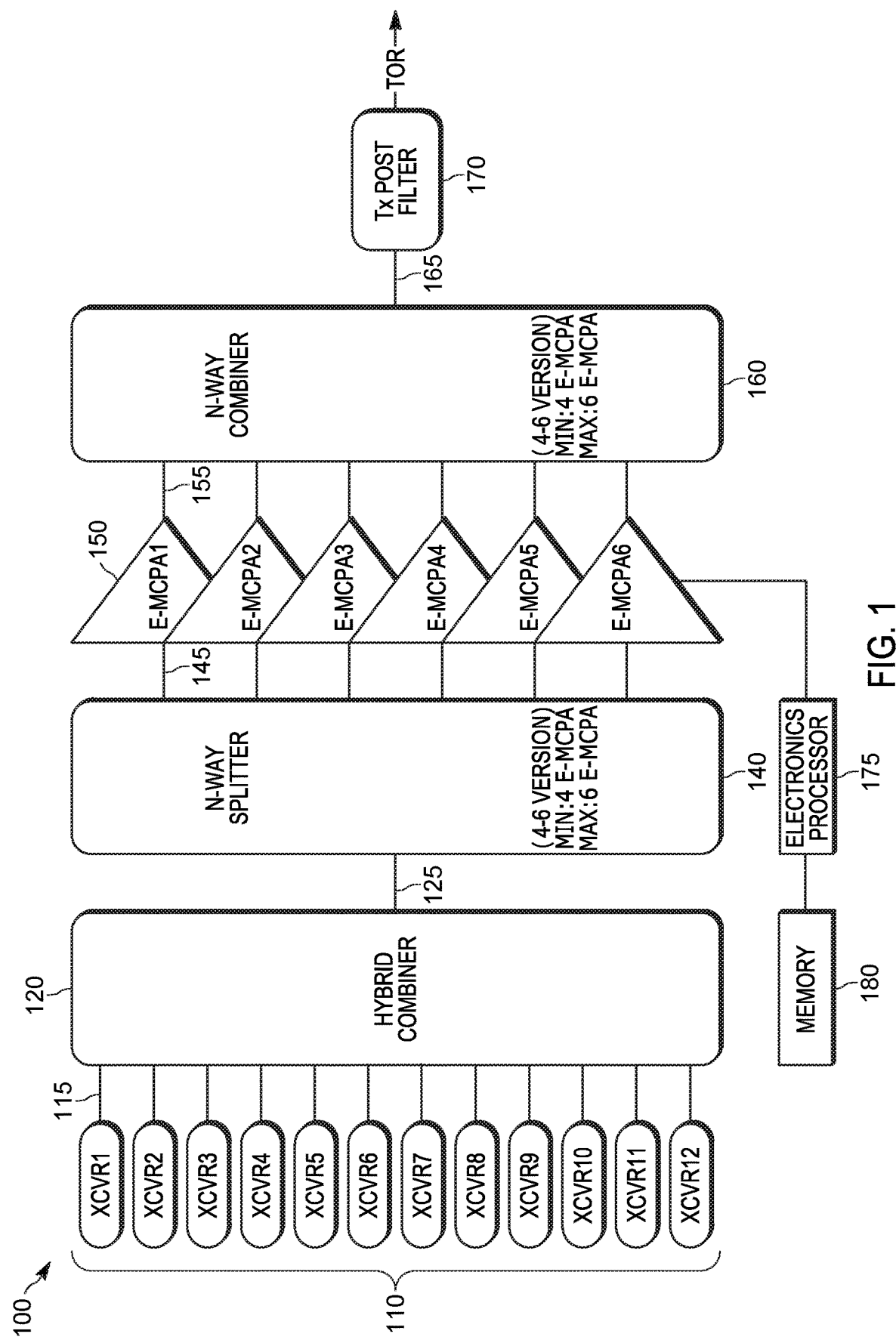
FIG. 1 is a simplified block diagram of a radio frequency (RF) transmitter in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

In Land Mobile Radio (LMR) systems, such as those implemented by public safety organizations, the carrier attributes of the carrier signals are dynamic. For example, the bandwidth, frequency, power level, modulation, and the like are changed according to a predetermined schedule. Multi-carrier systems used in cellular implementations are not suitable for LMR system. These multi-carrier systems are: (i) not compliant to emission requirements in the LMR spectrum; (ii) not optimized or designed to address dynamic carrier conditions in a timely manner; (iii) not scalable; and (iv) not fault tolerant.

Accordingly, there is a need for a frequency agile multi-carrier system that is optimized for LMR implementations.

One embodiment provides a radio frequency (RF) transmitter including one or more banks of multi-carrier power amplifiers having a plurality of multi-carrier power amplifiers. Each of the plurality of multi-carrier power amplifiers include a linearizer. The RF transmitter includes an electronic processor coupled to the plurality of multi-carrier power amplifiers. The electronic processor is configured to receive timestamped carrier configurations and segment the timestamped carrier configurations into time segments having a pre-determined time length. The electronic processor is also configured to determine composite carrier configuration in a present time segment for a predetermined number of future time segments and determine a correction solution of a plurality of correction solutions associated with the composite carrier configuration in a mapping of a plurality of carrier configurations and the plurality of correction solutions. The electronic processor is configured to provide the correction solution to the linearizer of at least one of the plurality of multi-carrier power amplifiers.

Another embodiment provides a method for selective linearization of a scalable fault tolerant frequency agile transmitter. The method includes receiving, using an electronic processor, timestamped carrier configurations and segmenting, using the electronic processor, the timestamped carrier configurations into time segments having a pre-determined time length. The method also includes determining, using the electronic processor, composite carrier configuration in a present time segment for a predetermined number of future time segments and determining, using the electronic processor, a correction solution of a plurality of correction solutions associated with the composite carrier configuration in a mapping of a plurality of carrier configurations and the plurality of correction solutions. The method includes providing, using the electronic processor, the correction solution to a linearizer of at least one of a plurality of multi-carrier power amplifiers. The plurality of power amplifiers are provided in one or more banks of multi-carrier power amplifiers.

FIG. 1 is a block diagram of an RF transmitter 100 in accordance with some embodiments. The RF transmitter 100 is, for example, part of a land mobile radio base station site deployed by a public safety organization (for example, a police department, a fire department, and the like). The RF transmitter 100 may include more or fewer components than those illustrated in FIG. 1 and may perform more or fewer functions than those described herein. In the example illustrated, the RF transmitter 100 includes a plurality of transceivers 110, a hybrid combiner 120, an N-way splitter 140, a plurality of multi-carrier power amplifiers 150, an N-way combiner 160, and a transmission post filter 170. In one example, the RF transmitter 100 can support up to twelve carriers and includes twelve transceivers 110 each designated for a single carrier. The following description is explained with respect to the above example of twelve carriers. However, it will be appreciated that the scope of the present disclosure is also applicable to a RF transmitter 100 having a different number of carriers. The plurality of transceivers 110 generate carrier signals 115, encode the carrier signals 115 with information to be transmitted, and provide the encoded carrier signals 115 to the hybrid combiner 120.

The hybrid combiner 120 combines the carrier signals 115 from the plurality of transceivers 110 to provide a combined signal 125 to the N-way splitter 140. The N-way splitter 140 splits the combined signal 125 into split signals 145 corresponding to the number of multi-carrier power amplifiers 150. In the example illustrated, the N-way splitter 140 generates six split signals 145 each corresponding to one of six multi-carrier power amplifiers 150. The split signals 145 are provided to the corresponding multi-carrier power amplifiers 150.

The plurality of multi-carrier power amplifiers 150 are connected in parallel between the N-way splitter 140 and the N-way combiner 160. The plurality of multi-carrier power amplifiers 150 amplify the split signals 145 for transmission and generate amplified signals 155. In some embodiments, a predistorter loop and a feed forward correction loop may be provided for each multi-carrier power amplifier 150 to reduce the distortion caused by the multi-carrier power amplifier 150 in the amplified signals 155. The amplified signals 155 are provided to the N-way combiner 160. The N-way combiner 160 combines the amplified signals 155 into a transmission signal 165 that is sent through the transmission post filter 170 prior to broadcasting with an antenna into the radio frequency spectrum. The N-way splitter 140 and the N-way combiner 160 are, for example, N-way splitters/combiners that are designed for a minimum number and a maximum number of multi-carrier power amplifiers 150 connected in parallel. An example N-way splitter/combiner system is provided in U.S. Pat. No. 5,543,751, the entire contents of which are hereby incorporated by reference. In the example illustrated, the N-way splitter 140 and the N-way combiner 160 are designed for a minimum of four multi-carrier power amplifiers 150 and a maximum of six multi-carrier power amplifiers 150.

An electronic processor 175 is coupled to the plurality of multi-carrier power amplifiers 150 and provides control signals to the plurality of multi-carrier power amplifiers 150. The electronic processor 175 is also coupled to a memory 180. In some embodiments, the RF transmitter 100 includes one electronic processor 175 and one memory 180 controlling the plurality of multi-carrier power amplifiers 150. In some embodiments, the RF transmitter 100 includes one electronic processor 175 and one memory 180 per multi-carrier power amplifier 150 that work together to implement the functionality as described herein. In some embodiments, the electronic processor 175 is implemented as a microprocessor with separate memory, for example, the memory 180. In other embodiments, the electronic processor 175 is implemented as a microcontroller or digital signal processor (with memory 180 on the same chip). In other embodiments, the electronic processor 175 is implemented using multiple processors. In addition, the electronic processor 175 may be implemented partially or entirely as, for example, a field-programmable gate array (FPGA), an application specific integrated circuit (ASIC), and the like and the memory 180 may not be needed or be modified accordingly. In the example illustrated, the memory 180 includes non-transitory, computer-readable memory that stores instructions that are received and executed by the electronic processor 175 to carry out the functionality of the RF transmitter 100 described herein. The memory 180 may include, for example, a program storage area and a data storage area. The program storage area and the data storage area may include combinations of different types of memory, for example, read-only memory and random-access memory.

In some embodiments, the electronic processor 175 determines a carrier configuration of the RF transmitter 100 based on the specifications provided by the organization implementing the RF transmitter 100. That is, the electronic processor 175 determines the carrier configuration may determine the carrier configuration based on the initial set up of a base station including the RF transmitter 100. In some embodiments, the electronic processor 175 may include a multi-carrier scheduler module or communicate with a multi-carrier scheduler module of the RF transmitter 100 to determine the carrier configuration of the RF transmitter 100. The multi-carrier scheduler provides the carrier configuration for every predetermined period of time. For example, the multi-carrier scheduler may provide the carrier configuration for every 100 milliseconds or less. Accordingly, each carrier configuration is active for a timeslot of 100 milliseconds or less. In some embodiments, the carrier configuration remains the same for large chunks of time, for example, during an active voice call with a single subscriber device. In some embodiments, the carrier configuration may change depending on the number of subscriber devices communicating with the RF transmitter 100.

Figure 2:
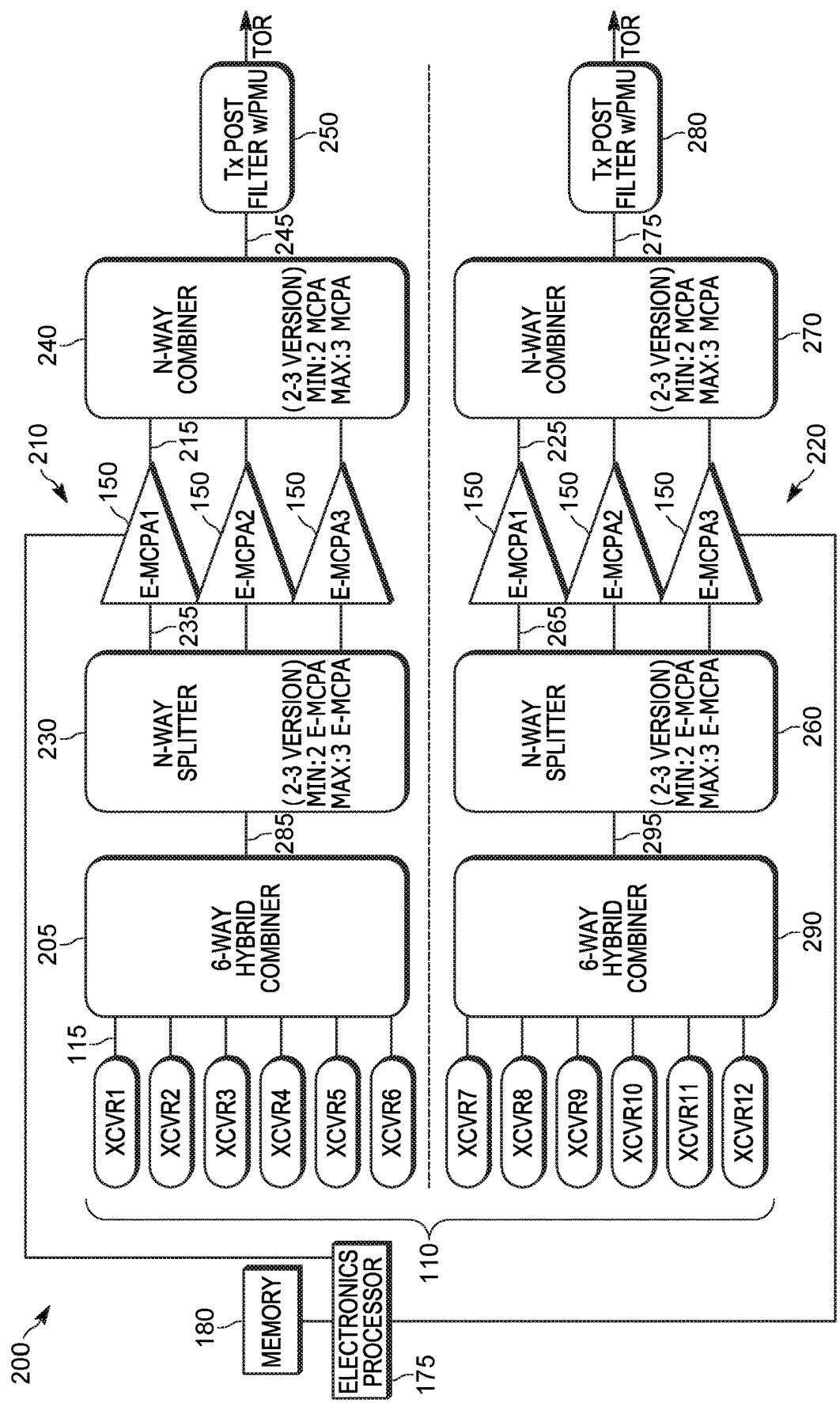
FIG. 2 is a simplified block diagram of a RF transmitter in accordance with some embodiments.

FIG. 2 illustrates an RF transmitter 200 in accordance with some embodiments. The RF transmitter 200 is similar to the RF transmitter 100 and includes similar components. In the example illustrated, the RF transmitter 200 includes two multi-carrier amplifier banks rather than a single bank as in the RF transmitter 100. The RF transmitter 200 includes a first bank of multi-carrier power amplifiers 210 and a second bank of multi-carrier power amplifiers 220 (for example, the one or more banks of multi-carrier power amplifiers). The plurality of multi-carrier power amplifiers 150 are divided symmetrically or asymmetrically between the first bank of multi-carrier power amplifiers 210 and the second bank of multi-carrier power amplifiers 220.

The first bank of multi-carrier power amplifiers 210 is coupled to a first N-way splitter 230 and a first N-way combiner 240. A first transmission post filter 250 is coupled to the first N-way combiner 240. The second bank of multi-carrier power amplifiers 220 is coupled to a second N-way splitter 260 and a second N-way combiner 270. A second transmission post filter 280 is coupled to the second N-way combiner 270.

A first hybrid combiner 205 combines the carrier signals 115 from a first subset of the plurality of transceivers 110 (for example, first six transceivers 110) to provide a first combined signal 285 to the first N-way splitter 230. A second hybrid combiner 290 combines the carrier signals 115 from a second subset of the plurality of transceivers 110 (for example, second six transceivers 110) to provide a second combined signal 295 to the second N-way splitter 260. The first N-way splitter 230 splits the first combined signal 285 into first split signals 235 corresponding to the number of the multi-carrier power amplifiers 150. In the example illustrated the first N-way splitter 230 generates three first split signals 235 each corresponding to one of the multi-carrier power amplifiers 150. The first split signals 235 are provided to the corresponding multi-carrier power amplifiers 150. The second N-way splitter 260 splits the second combined signal 295 into second split signals 265 corresponding to the number of multi-carrier power amplifiers 150. In the example illustrated, the second N-way splitter 260 generates three second split signals 265 each corresponding to one of the multi-carrier power amplifiers 150. The second split signals 265 are provided to the corresponding multi-carrier power amplifiers 150.

Figure 3:
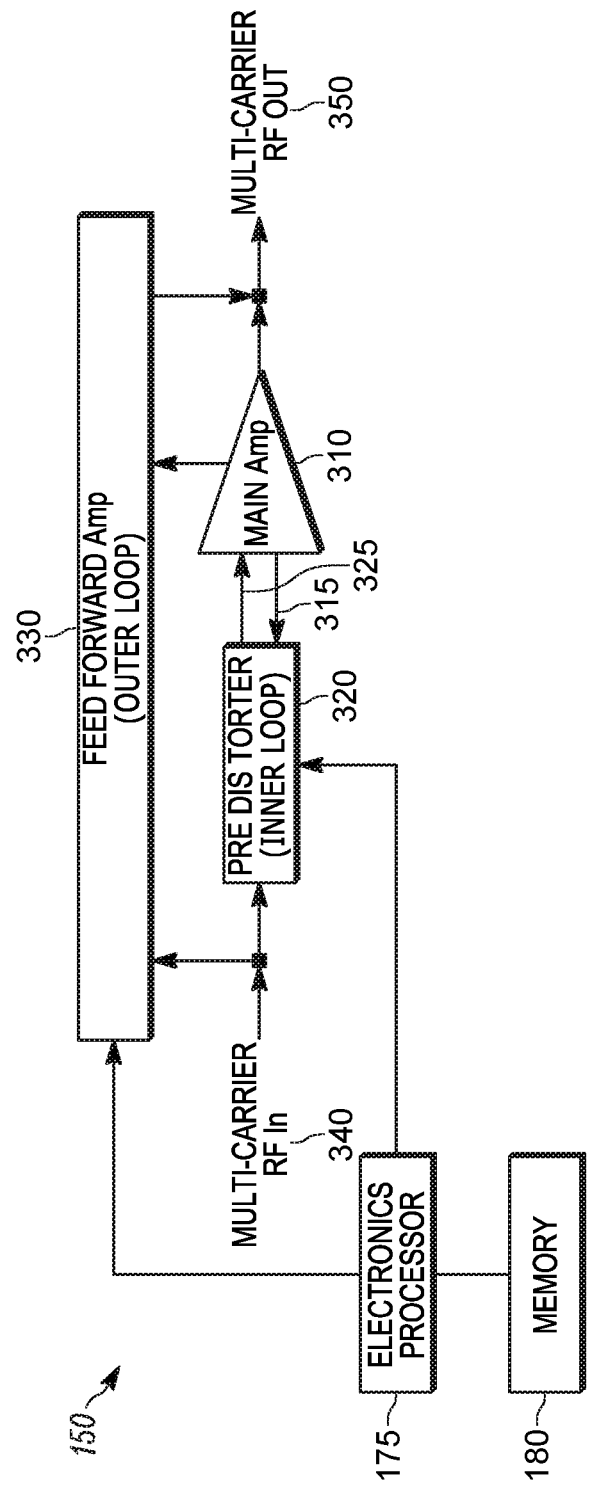
FIG. 3 is a simplified block diagram of a multi-carrier power amplifier of the RF transmitter of FIG. 1 or 2 in accordance with some embodiments.

The multi-carrier power amplifiers 150 are connected in parallel between the first N-way splitter 230 and the first N-way combiner 240 and between the second N-way splitter 260 and the second N-way combiner 270. The first N-way splitter 230 and the first N-way combiner 240 are together referred to as the first N-way splitter-combiner system 230, 240. In other words, the first N-way splitter-combiner system 230, 240 is coupled to the first bank of multi-carrier power amplifiers 210. The first bank of multi-carrier power amplifiers 210 amplify the first split signals 235 for transmission and generate first amplified signals 215. In some embodiments, a predistorter loop and a feed forward correction loop may be provided for each multi-carrier power amplifier 150 to reduce the distortion caused by the multi-carrier power amplifier 150 in the first amplified signals 215 (for example, as shown in FIG. 3). The first amplified signals 215 are provided to the first N-way combiner 240. The first N-way combiner 240 combines the first amplified signals 215 into a first transmission signal 245 that is sent through the first transmission post filter 250 prior to broadcasting with an antenna into the radio frequency spectrum. The second N-way splitter 260 and the second N-way combiner 270 are together referred to as the second N-way splitter-combiner system 260, 270. In other words, the second N-way splitter-combiner system 260, 270 is coupled to the second bank of multi-carrier power amplifiers 220. The second bank of multi-carrier power amplifiers 220 amplifies the second split signals 265 for transmission and generate second amplified signals 225. In some embodiments, a predistorter loop and a feed forward correction loop may be provided for each multi-carrier power amplifier 150 to reduce the distortion caused by the multi-carrier power amplifier 150 in the second amplified signals 225 (for example, as shown in FIG. 3). The second amplified signals 225 are provided to the second N-way combiner 270. The second N-way combiner 270 combines the second amplified signals 225 into a second transmission signal 275 that is sent the second transmission post filter 280 prior to broadcasting with an antenna into the radio frequency spectrum.

Additional embodiments of the RF transmitter 100 are described in co-pending application titled "EFFICIENT OPERATION OF MULTI-CARRIER POWER AMPLIFIERS IN DYNAMIC CARRIER SYSTEMS" assigned application Ser. No. 16/231,293, the entire contents of which are hereby incorporated by reference.

FIG. 3 is a block diagram of the multi-carrier power amplifier 150 in accordance with some embodiments. The multi-carrier power amplifier 150 includes a main amplifier 310, a predistorter correction loop 320 (for example, a linearizer), and a feed forward correction loop 330 (for example, a linearizer). The predistorter correction loop 320 and the feed forward correction loop 330 are controlled by the electronic processor 175. The main amplifier 310 receives a multi-carrier radio frequency (RF) input signal 340 (for example, the split signals 145, 235, 265) and amplifies the multi-carrier RF input signal 340 to generate a multi-carrier radio frequency (RF) output signal 350 (for example, the amplified signals 155, 215, 225).

The predistorter correction loop 320 includes a radio frequency (RF) power amplifier linearizer that predistorts the multi-carrier RF input signal 340 before the multi-carrier RF input signal 340 is provided to the main amplifier 310. One embodiment of the predistorter correction loop 320 is described in co-pending application titled "DYNAMICALLY LINEARIZING MULTI-CARRIER POWER AMPLIFIERS" assigned application Ser. No. 16/231,306, the entire contents of which are hereby incorporated by reference.

The predistorter correction loop 320 receives the multi-carrier RF input signal 340 and provides a predistorted signal to the multi-carrier RF input signal 340 to generate a predistorted input signal 325. The predistorted input signal 325 is generated by creating even order intermodulation terms of the multi-carrier RF input signal 340 by applying a non-linear transformation and multiplying the intermodulation terms with a correction solution to generate inverse intermodulation distortion. The correction solution includes, for example, a set of coefficients that are multiplied to the intermodulation terms. The predistorted input signal 325 is then amplified by the main amplifier 310 to provide the multi-carrier RF output signal 350. The intermodulation distortion generated by the main amplifier 310 is thus canceled by the inverse intermodulation distortion introduced in the multi-carrier RF input signal 340. The predistorter correction loop 320 also receives the multi-carrier RF output signal 350 through a feedback signal 315. The predistorter correction loop 320 determines the correction solution based on a starting correction solution, as determined by the electronic processor 175 with the present carrier conditions, and the feedback signal 315.

The electronic processor 175 communicates with the predistorter correction loop 320 to control the predistorter correction loop 320. The electronic processor 175 can activate and deactivate the predistorter correction loop 320. In some embodiments, the electronic processor 175 provides the initial correction solutions to the predistorter correction loop 320 as described in co-pending application titled "DYNAMICALLY LINEARIZING MULTI-CARRIER POWER AMPLIFIERS" assigned application Ser. No. 16/231,306.

The feed forward correction loop 330 linearizes the multi-carrier RF output signal 350. The multi-carrier RF output signal 350 includes distortion components (that is, $3^{rd}$ order components, $5^{th}$ order components, and so on) that may interfere with other channels on the network. The feed forward correction loop 330 performs feed forward compensation to reduce the distortion components in the multi-carrier RF output signal 350 to reduce interference on neighboring channels. The electronic processor 175 communicates with the feed forward correction loop 330 to control the feed forward correction loop 330. The electronic processor 175 can activate and deactivate the feed forward correction loop 330.

Accordingly, the RF transmitters 100 and 200 provide a scalable, fault tolerant, frequency agile, transmitter. The RF transmitters 100, 200 are scalable to be used with numerous carriers. In one example, the RF transmitter 200 is scalable to be used from one to twelve carriers. The RF transmitters 100, 200 are fault tolerant because when a fault in a multi-carrier power amplifier 150 is detected, other multi-carrier power amplifiers 150 in the same bank or a different bank may be used in place of the faulty multi-carrier power amplifier 150. The RF transmitters 100, 200 are frequency agile since the frequency of the carrier signals 115 may be changed dynamically without needing additional maintenance. The RF transmitters 100, 200 can be selectively linearized using the electronic processor 175. In one example, the electronic processor 175 selectively activates the required amount of multi-carrier power amplifiers 150 and selectively activates the correction loops 320, 330 (for example, the predistorter correction loop 320 and the feed forward correction loop 330) of the multi-carrier power amplifiers 150 as further described below.

Figure 4:
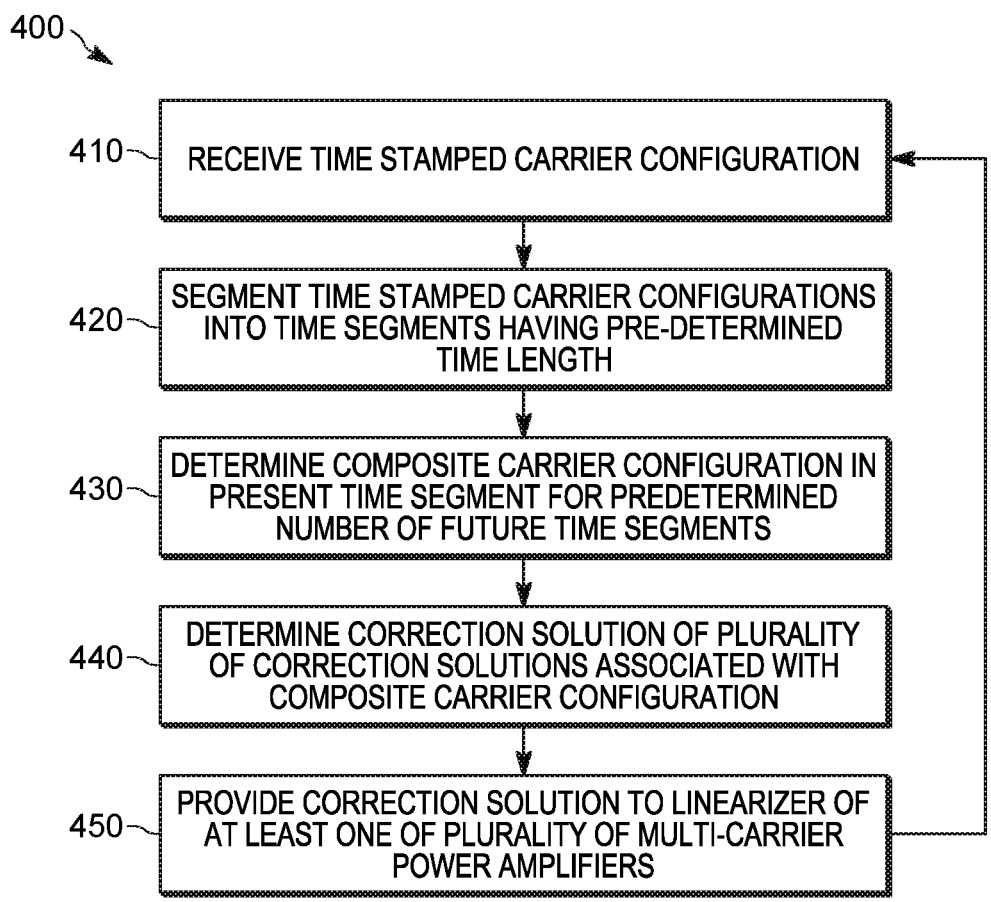
FIG. 4 is a flowchart of an example method for selective linearization of a scalable fault tolerant frequency agile transmitter of FIG. 1 or 2.

FIG. 4 illustrates a flowchart of an example method 400 for selective linearization of a scalable fault tolerant frequency agile transmitter (that is, the RF transmitters 100, 200) in accordance with some embodiments. In the example illustrated, the method 400 includes receiving, using the electronic processor 175, timestamped carrier configurations (at block 410). As discussed above, the electronic processor 175 may include a multi-carrier scheduler module or communicate with a multi-carrier scheduler module of the RF transmitter 100, 200 to determine the carrier configuration of the RF transmitter 100, 200. The multi-carrier scheduler provides the carrier configuration for every predetermined period of time. For example, the multi-carrier scheduler may provide the carrier configuration for every 100 milliseconds or less. Accordingly, each carrier configuration is active for a timeslot of 100 milliseconds or less. The timestamped carrier configurations includes a correlation between a plurality of timestamps and a plurality of carrier attributes. In one example, the timestamped carrier configuration includes information regarding when a carrier attribute change of the plurality of carrier attributes is scheduled to take effect. The electronic processor 175 communicates with the multi-carrier scheduler to receive the timestamped carrier configurations for the RF transmitter 100, 200.

Figure 5:
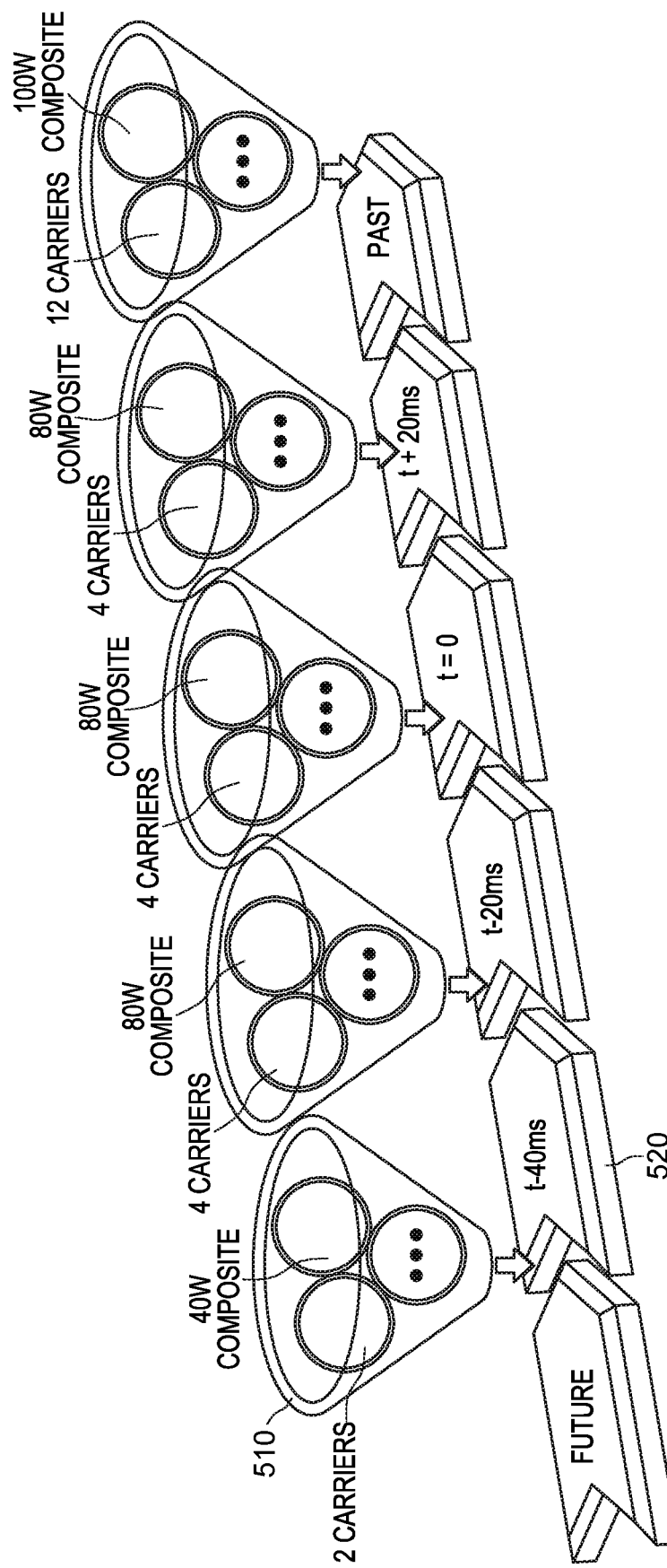
FIG. 5 illustrates an example time segmentation of carrier configuration information performed by an electronic processor of the RF transmitter of FIG. 1 or 2 in accordance with some embodiments.

The method 400 also includes segmenting, using the electronic processor 175, the timestamped carrier configurations into time segments having a pre-determined time length (at block 420). The electronic processor 175 receives carrier configuration information that includes the change in carrier attributes of carrier signals 115 and the timestamp at which the carrier attributes are scheduled to be changed. Referring to FIG. 5, the electronic processor 175 divides the information 510 into time segments 520 (also referred to as timeslots) having a predetermined time period (for example, 20 ms). The time segments 520 are modified as new information 510 is received by the electronic processor 175. The carrier configuration information 510 is received before the carrier attribute changes are scheduled to take effect such that the electronic processor 175 can include the carrier attribute changes in the appropriate time segment 520. Accordingly, for each time segment 520, the electronic processor 175 correlates carrier configuration information 510 for the RF transmitter 100, 200.

The method 400 also includes determining, using the electronic processor 175, composite carrier configuration in a present time segment 520 for a predetermined number of future time segments 520 (at block 430). Referring to FIG. 5, for example, the electronic processor 175 determines the composite carrier configuration for two time segments 520 (that is, time segment t-20 ms and time segment t-40 ms) at the present time segment 520 (that is time segment t=0).

Figure 6:
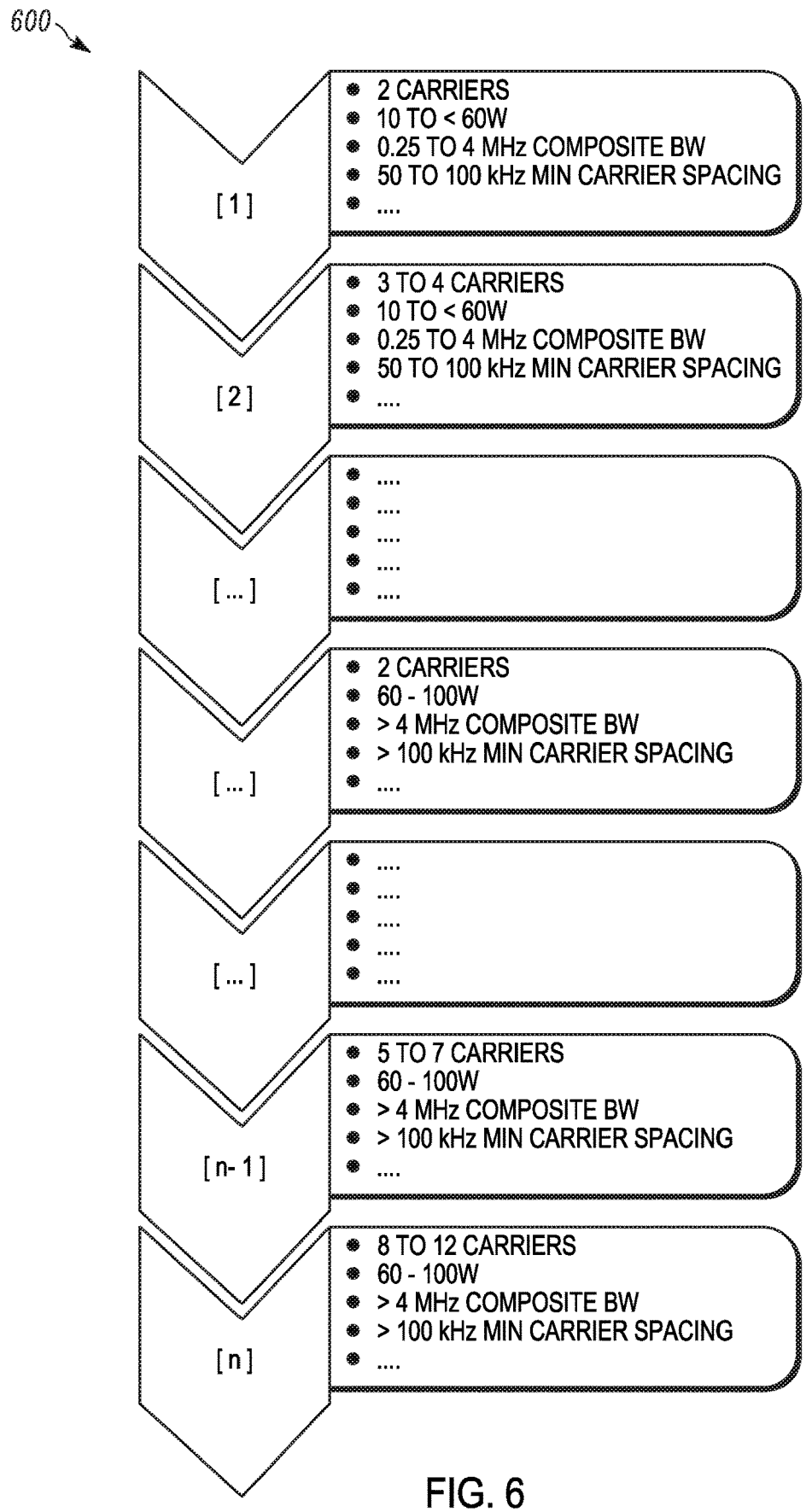
FIG. 6 illustrates an example lookup table stored in a memory of the RF transmitter of FIG. 1 or 2 in accordance with some embodiments.

The method 400 also includes determining, using the electronic processor 175, a correction solution of the plurality of correction solutions associated with the composite carrier configuration in a mapping of a plurality of carrier configurations and a plurality of correction solutions (at block 440). The mapping of the plurality of carrier configuration and the plurality of correction solutions is stored in, for example, the memory 180. The memory 180 may store the mapping in, for example, a look up table. FIG. 6 illustrates an example lookup table 600 storing a mapping of a plurality of carrier configurations and a plurality of correction solutions. The plurality of carrier configurations include information regarding the carrier and the carrier attributes, for example, number of radio frequency (RF) carriers, a sum of root mean square power for each of the RF carriers, a difference in frequency between a highest RF carrier and a lowest RF carrier, a difference between an adjacent RF carrier pair frequency difference and a minimum frequency difference, a sum of peak power for each of the RF carriers, carrier bandwidths of each of the RF carriers, and the like. The plurality of correction solutions include, for example, an enable/disable state of the correction loop (for example, the predistorter correction loop 320 or the feed forward correction loop 330) and an initial correction set for the correction loop. In some embodiments, the plurality of correction solutions include a present correction set of the correction loop. In some embodiments, the time stamped carrier configurations include an enable/disable state of the one or more banks of multi-carrier power amplifiers 210, 220.

The electronic processor 175 refers the lookup table 600 stored in the memory 180 to determine the correction solution or correction set associated with the composite carrier configuration. In some embodiments, the correction solution includes the state (for example, the enable/disable state) of one of the correction loops 320, 330. For example, for certain carrier configurations, the transmitter output requirements (that is, intermodulation distortion levels) can be met without the correction from one or both the correction loops 320, 330. In these embodiments, the correction solution includes deactivating the one or more correction loops 320, 330. In other embodiments, the correction solution includes initial settings of the one or more correction loops 320, 330. For example, the correction solutions includes an initial set of coefficients for the predistorter correction loop 320 and/or the initial settings of a phase shifter, a gain shifter, and a phase extender for the feed forward correction loop 330.

The method 400 includes providing, using the electronic processor 175, the correction solution to a linearizer (that is, the predistorter 320 or the feed forward correction loop 330) of at least one of the plurality of multi-carrier power amplifiers 150 (at block 450). Based on the composite carrier configuration, the electronic processor 175 activates the desired banks of multi-carrier power amplifiers 210, 220 and the desired number of multi-carrier power amplifiers 150. That is, the electronic processor 175 activates or deactivates the one or more banks of multi-carrier power amplifiers 210, 220. The electronic processor 175 also activates or deactivates the correction loops 320, 330 and provides the initial correction sets to the correction loops 320, 330. Accordingly, the electronic processor 175 selectively linearizes the carrier signals 115 by activating and deactivating the correction loops 320, 330.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A radio frequency (RF) transmitter comprising:
   one or more banks of multi-carrier power amplifiers including a plurality of multi-carrier power amplifiers, each of the plurality of multi-carrier power amplifiers including a linearizer; and
   an electronic processor coupled to the plurality of multi-carrier power amplifiers and configured to
      receive timestamped carrier configurations,
      segment the timestamped carrier configurations into time segments having a pre-determined time length,
      determine composite carrier configuration in a present time segment for a predetermined number of future time segments,
      determine a correction solution of a plurality of correction solutions associated with the composite carrier configuration in a mapping of a plurality of carrier configurations and the plurality of correction solutions, and
      provide the correction solution to the linearizer of at least one of the plurality of multi-carrier power amplifiers.

2. The RF transmitter of claim 1, wherein the linearizer is one selected from a group consisting of a predistorter and a feed forward correction loop.

3. The RF transmitter of claim 1, wherein the composite carrier configuration includes at least one selected from a group consisting of: number of radio frequency (RF) carriers, a sum of root mean square power for each of the RF carriers, a difference in frequency between a highest RF carrier and a lowest RF carrier, a difference between an adjacent RF carrier pair frequency difference and a minimum frequency difference, a sum of peak power for each of the RF carriers, median RF carrier frequency, and carrier bandwidths of each of the RF carriers.

4. The RF transmitter of claim 1, wherein the correction solution includes at least one selected from a group consisting of: an enable/disable state of the linearizer and an initial correction set for the linearizer.

5. The RF transmitter of claim 1, wherein the timestamped carrier configurations includes an enable/disable state of the one or more banks of multi-carrier power amplifiers.

6. The RF transmitter of claim 5, wherein the electronic processor is further configured to activate the one or more banks of multi-carrier power amplifiers based on the enable/disable state of the one or more banks of multi-carrier power amplifiers.

7. The RF transmitter of claim 1, further comprising a memory coupled to the electronic processor and configured to store the mapping of the plurality of carrier configurations and the plurality of correction solutions.

8. A method for selective linearization of a scalable fault tolerant frequency agile transmitter, the method comprising:
   receiving, using an electronic processor, timestamped carrier configurations,
   segmenting, using the electronic processor, the timestamped carrier configurations into time segments having a pre-determined time length,
   determining, using the electronic processor, composite carrier configuration in a present time segment for a predetermined number of future time segments, determining, using the electronic processor, a correction solution of a plurality of correction solutions associated with the composite carrier configuration in a mapping of a plurality of carrier configurations and the plurality of correction solutions, and providing, using the electronic processor, the correction solution to a linearizer of at least one of a plurality of multi-carrier power amplifiers, the plurality of multi-carrier power amplifiers provided in one or more banks of multi-carrier power amplifiers.

9. The method of claim 8, wherein the linearizer is one selected from a group consisting of a predistorter and a feed forward correction loop.

10. The method of claim 8, wherein the composite carrier configuration includes at least one selected from a group consisting of: number of radio frequency (RF) carriers, a sum of root mean square power for each of the RF carriers, a difference in frequency between a highest RF carrier and a lowest RF carrier, a difference between an adjacent RF carrier pair frequency difference and a minimum frequency difference, a sum of peak power for each of the RF carriers, median RF carrier frequency, and carrier bandwidths of each of the RF carriers.

11. The method of claim 8, wherein the correction solution includes at least one selected from a group consisting of: an enable/disable state of the linearizer and an initial correction set for the linearizer.

12. The method of claim 8, wherein the timestamped carrier configurations includes an enable/disable state of the one or more banks of multi-carrier power amplifiers.

13. The method of claim 12, wherein the electronic processor is further configured to activating, using the electronic processor, the one or more banks of multi-carrier power amplifiers based on the enable/disable state of the one or more banks of multi-carrier power amplifiers.

14. The method of claim 8, further comprising storing, using a memory, the mapping between the plurality of carrier configurations and the plurality of correction solutions.

\* \* \* \* \*